(12) United States Patent
Shibata et al.

(10) Patent No.: US 12,527,017 B2
(45) Date of Patent: Jan. 13, 2026

(54) BIDIRECTIONAL THYRISTOR

(71) Applicant: SHINDENGEN ELECTRIC MANUFACTURING CO., LTD., Tokyo (JP)

(72) Inventors: Yukihiro Shibata, Asaka (JP); Tadashi Inoue, Asaka (JP); Yasutoshi Tsuboi, Asaka (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 419 days.

(21) Appl. No.: 18/041,089

(22) PCT Filed: Sep. 13, 2022

(86) PCT No.: PCT/JP2022/034223
§ 371 (c)(1),
(2) Date: Feb. 9, 2023

(87) PCT Pub. No.: WO2023/053945
PCT Pub. Date: Apr. 6, 2023

(65) Prior Publication Data
US 2024/0274700 A1 Aug. 15, 2024

(30) Foreign Application Priority Data

Sep. 29, 2021 (JP) ................... 2021-158660

(51) Int. Cl.
*H10D 18/80* (2025.01)
*H10D 62/13* (2025.01)
(52) U.S. Cl.
CPC ........... *H10D 18/80* (2025.01); *H10D 62/133* (2025.01)
(58) Field of Classification Search
CPC ....... H10D 18/80; H10D 18/00; H10D 18/021
See application file for complete search history.

(56) References Cited

U.S. PATENT DOCUMENTS 4,994,885 A * 2/1991 Yoshizawa ............. H10D 18/80
257/163
6,037,613 A * 3/2000 Mariyama ............. H10F 30/263
257/175

FOREIGN PATENT DOCUMENTS

JP        6-342902 A     12/1994
JP    2009-245987 A     10/2009
(Continued)

OTHER PUBLICATIONS

International Search Report from International Application No. PCT/JP2022/034223 dated Nov. 29, 2022, 3 pgs.

*Primary Examiner* — Syed I Gheyas
(74) *Attorney, Agent, or Firm* — Tutunjian & Bitetto, P.C.

(57) ABSTRACT

A bidirectional thyristor capable of improving (dv/dt)c capability includes first and second first-conductivity-type semiconductor layers; first and second second-conductivity-type semiconductor layers; a plurality of carrier emitting portions disposed on a third second-conductivity-type semiconductor layer; a fourth second-conductivity-type semiconductor layer; first and second electrodes; a gate electrode; and a passivation film. The plurality of carrier emitting portions are configured such that an opening is formed in the third second-conductivity-type semiconductor layer and the first first-conductivity-type semiconductor layer is located in the opening. In plan view, the carrier emitting portions are disposed between a position away from the gate electrode by a predetermined distance and an outer edge of the first electrode. The plurality of carrier emitting portions are disposed in contact with the outer edge of the first electrode which is in contact with a passivation film.

3 Claims, 11 Drawing Sheets

(56) References Cited

FOREIGN PATENT DOCUMENTS

| JP | 2010-245377 A | 10/2010 |
|---|---|---|
| WO | 2017046944 A1 | 3/2017 |
| WO | 2018167871 A1 | 9/2018 |

* cited by examiner

BIDIRECTIONAL THYRISTOR

CROSS REFERENCE TO RELATED APPLICATION

This patent application claims the benefit and priority of Japanese Patent Application No. 2021-158660 filed on Sep. 29, 2021, the disclosure of which is incorporated by reference herein in its entirety as part of the present application.

TECHNICAL FIELD

The present invention relates to a bidirectional thyristor.

BACKGROUND ART

In conventional bidirectional thyristors, even immediately after a current flows from a first electrode (T1 electrode) to a second electrode (T2 electrode) to perform thyristor operation and the current stops flowing, carriers remain and are diffused in a transverse direction. Thus, when bias is applied to the second electrode (T2 electrode), even if bias is not applied to a gate electrode, the remaining carriers exhibit the same effect as a gate trigger current, and a phenomenon of false turn-on, which shifts to on-operation, may occur. The less possibility of false turn-on is expressed by (dv/dt)c capability, and the improvement in (dv/dt)c capability is sought after while securing thyristor characteristics. Note that a conventional bidirectional thyristor is disclosed in, for example, Japanese Patent Application Publication No. 2010-245377.

SUMMARY OF INVENTION

Problems to be Solved

Various aspects of the present invention have an object to provide a bidirectional thyristor capable of improving (dv/dt)c capability.

Solution to Problem

Various aspects of the present invention are described below.

A bidirectional thyristor, including a first first-conductivity-type semiconductor layer and
a first second-conductivity-type semiconductor layer is disposed on a rear surface side of the first first-conductivity-type semiconductor layer. A second first-conductivity-type semiconductor layer is disposed on a rear surface side of the first second-conductivity-type semiconductor layer, and a second second-conductivity-type semiconductor layer is disposed on a rear surface side of the second first-conductivity-type semiconductor layer. A third second-conductivity-type semiconductor layer is disposed on a front surface side of the first first-conductivity-type semiconductor layer, and a plurality of carrier emitting portions are disposed on the third second-conductivity-type semiconductor layers. A fourth second-conductivity-type semiconductor layer is disposed on the front surface side of the first first-conductivity-type semiconductor layer. A first electrode contacts the third second-conductivity-type semiconductor layer, the plurality of carrier emitting portions, and the first first-conductivity-type semiconductor layer. A second electrode contacts the second second-conductivity-type semiconductor layer and the second first-conductivity-type semiconductor layer. A gate electrode contacts the fourth second-conductivity-type semiconductor layer and the first first-conductivity-type semiconductor layer. A passivation film is disposed on a boundary between the first first-conductivity-type semiconductor layer and the first second-conductivity-type semiconductor layer and a boundary between the first second-conductivity-type semiconductor layer and the second first-conductivity-type semiconductor layer on the front surface side of the first first-conductivity-type semiconductor layer. Each of the plurality of carrier emitting portions are configured such that an opening is formed in the third second-conductivity-type semiconductor layer and the first first-conductivity-type semiconductor layer is located in the opening. In plan view, the plurality of carrier emitting portions are disposed between a position away from the gate electrode by a predetermined distance and an outer edge of the first electrode, and two or more of the plurality of carrier emitting portions are disposed in contact with the outer edge of the first electrode which contacts the passivation film. In plan view, an area of a triangle formed by adjacent carrier emitting portions located at the outer edge of the first electrode and a carrier emitting portion located at a shortest distance from a straight line connecting the adjacent carrier emitting portions is smaller than an area of a quadrangle formed by carrier emitting portions that are not located at the outer edge of the first electrode.

In accordance with another embodiment, the two or more carrier emitting portions disposed in contact with the outer edge of the first electrode have a shape that is one of a cutout shape, a polygonal shape, or an elliptical shape in plan view.

In accordance with another embodiment, in plan view, a density of carrier emitting portions in a vicinity of the outer edge of the first electrode is higher than a density of carrier emitting portions in a region other than the vicinity of the outer edge of the first electrode.

In the bidirectional thyristor according to the present invention, two or more of the plurality of carrier emitting portions are disposed in contact with the outer edge of the first electrode. Even when a part of the plurality of carrier emitting portions are disposed at the outer edge of the first electrode, the reduction in area of the third second-conductivity-type impurity diffusion layer in contact with the first electrode is significantly small, which hardly affects VT characteristics and gate characteristics.

When ground (GND) is connected to the first electrode, a negative voltage is applied to the second electrode, and a negative voltage is applied to the gate electrode, a gate trigger current flows, so that a current flows through the first electrode, the first first-conductivity-type semiconductor layer, the first second-conductivity-type semiconductor layer, the second first-conductivity-type semiconductor layer, the second second-conductivity-type semiconductor layer, and the second electrode in this order due to thyristor operation. In this case, the carriers are diffused in a transverse direction, and the carriers remain even after the current stops flowing due to the thyristor operation. Next, when no bias is applied to the gate electrode and a positive voltage is applied to the second electrode, the remaining carriers are processed as ineffective current not via the third second-conductivity-type semiconductor layer but through the plurality of carrier emitting portions, thereby preventing false turn-on. In this case, in plan view, by setting the area of a triangle formed by adjacent carrier emitting portions located at the outer edge of the first electrode and a carrier emitting portion located at the shortest distance from a straight line connecting the adjacent carrier emitting portion to be smaller than the area of a quadrangle formed by carrier emitting portions that are not located at the outer edge of the first electrode, remaining carriers can be more effectively processed as ineffective current. Thus, false turn-on can be more effectively prevented, and (dv/dt)c capability can be improved.

In accordance with an embodiment of the bidirectional thyristor of the present invention, in plan view, the density of carrier emitting portions in a vicinity of the outer edge of the first electrode is higher than the density of carrier emitting portions in a region other than the vicinity of the outer edge of the first electrode. As a result, the remaining carriers can be more effectively processed as ineffective current not via the third second-conductivity-type semiconductor layer but through the carrier emitting portions disposed in the vicinity of the outer edge of the first electrode.

DESCRIPTION OF EMBODIMENTS

Embodiments of the present invention are described in detail below with reference to the drawings. The present invention is not limited to the following description, and a person skilled in the art could easily understand that the forms and details of the present invention can be variously changed without departing from the gist and scope of the present invention. Thus, the present invention is not intended to be interpreted as being limited to the following description of the embodiments.

A bidirectional thyristor according to one aspect of the present invention is described below.

Figure 1:
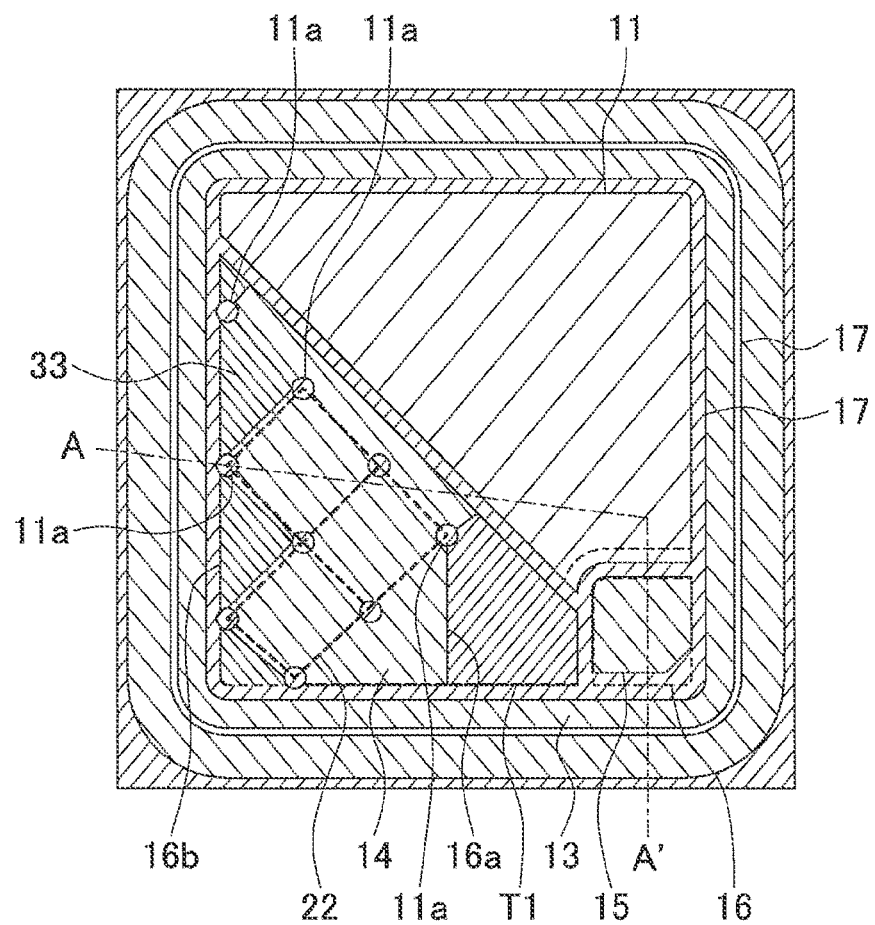
FIG. 1 is a plan view illustrating a bidirectional thyristor according to one aspect of the present invention.
Figure 2:
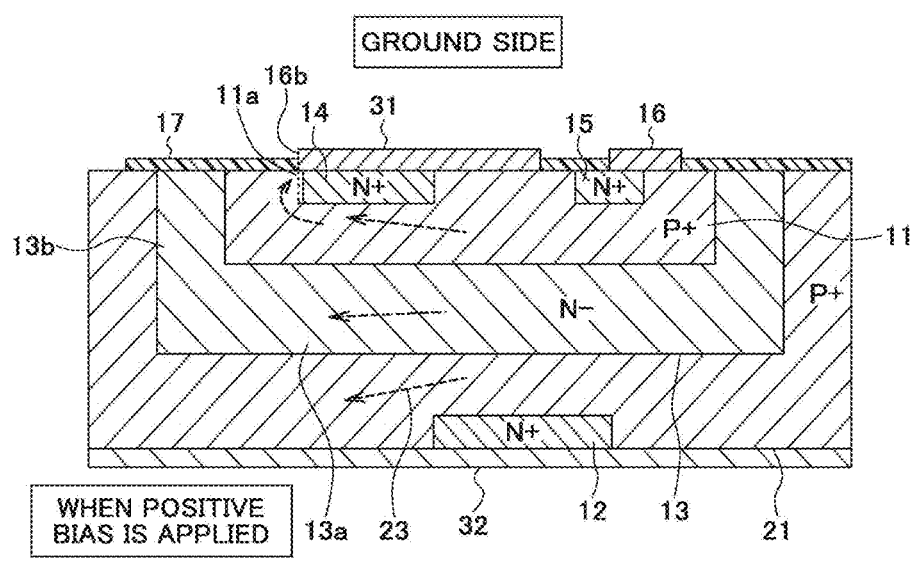
FIG. 2 is a cross-sectional view taken along the line A-A' illustrated in FIG. 1.

FIG. 1 is a plan view illustrating a bidirectional thyristor according to one aspect of the present invention. FIG. 2 is a cross-sectional view taken along the line A-A' illustrated in FIG. 1. Note that the cross-sectional view of the bidirectional thyristor illustrated in FIG. 2 omits a part of the bidirectional thyristor illustrated in FIG. 1.

A first first-conductivity-type semiconductor layer ($P^+$) 11 is formed on a front surface side (T1 electrode 31 side) of a second first-conductivity-type semiconductor layer ($P^+$) 21 as a $P^+$ type semiconductor substrate illustrated in FIG. 2.

On a rear surface side (T2 electrode 32 side) of the first first-conductivity-type semiconductor layer ($P^+$) 11, a first second-conductivity-type semiconductor layer ($N^-$) 13 is disposed (see FIG. 2).

The first second-conductivity-type semiconductor layer ($N^-$) 13 is formed such that the outer periphery (both ends illustrated in FIG. 2) thereof extends to the front surface side of the first first-conductivity-type semiconductor layer ($P^+$) 11 (see FIG. 1 and FIG. 2). In other words, as illustrated in FIG. 2, the first second-conductivity-type semiconductor layer ($N^-$) 13 is formed such that the first first-conductivity-type semiconductor layer ($P^+$) 11 is surrounded by a bottom portion 13a and side wall portions 13b.

On a rear surface side (T2 electrode 32 side) of the first second-conductivity-type semiconductor layer ($N^-$) 13, a second first-conductivity-type semiconductor layer ($P^+$) 21 is disposed.

On the second first-conductivity-type semiconductor layer ($P^+$) 21, a second second-conductivity-type semiconductor layer ($N^+$) 12 is formed, and the second second-conductivity-type semiconductor layer ($N^+$) 12 is located on the rear surface side (T2 electrode 32 side) of the second first-conductivity-type semiconductor layer ($P^+$) 21. In other words, as illustrated in FIG. 2, the first first-conductivity-type semiconductor layer ($P^+$) 11, the first second-conductivity-type semiconductor layer ($N^-$) 13, the second first-conductivity-type semiconductor layer ($P^+$) 21, and the second second-conductivity-type semiconductor layer ($N^+$) 12 are disposed in this order in a direction (first direction) from the front surface to the rear surface of the first first-conductivity-type semiconductor layer ($P^+$) 11, and these layers serve as a first path through which a current flows due to thyristor operation.

On the front surface side (T1 electrode 31 side) of the first first-conductivity-type semiconductor layer ($P^+$) 11, a third second-conductivity-type semiconductor layer ($N^+$) 14 is disposed. In other words, as illustrated in FIG. 2, the second first-conductivity-type semiconductor layer ($P^+$) 21, the first second-conductivity-type semiconductor layer ($N^-$) 13, the first first-conductivity-type semiconductor layer ($P^+$) 11, and the third second-conductivity-type semiconductor layer ($N^+$) 14 are disposed in this order in a direction (second direction) from the rear surface to the front surface of the second first-conductivity-type semiconductor layer ($P^+$) 21, and these layers serve as a second path through which a current flows due to thyristor operation.

As illustrated in FIG. 1, a plurality of carrier emitting portions 11a are disposed on the third second-conductivity-type semiconductor layer ($N^+$) 14.

As illustrated in FIG. 2, a fourth second-conductivity-type semiconductor layer ($N^+$) 15 is disposed on the front surface side of the first first-conductivity-type semiconductor layer ($P^+$) 11.

A first electrode (T1 electrode) 31 is disposed in contact with the third second-conductivity-type semiconductor layer ($N^+$) 14, the plurality of carrier emitting portions 11a, and the first first-conductivity-type semiconductor layer ($P^+$) 11.

A second electrode (T2 electrode) 32 is disposed in contact with the second second-conductivity-type semiconductor layer (N$^+$) 12 and the second first-conductivity-type semiconductor layer (P$^+$) 21.

A gate electrode 16 is disposed in contact with the fourth second-conductivity-type semiconductor layer (N$^+$) 15 and the first first-conductivity-type semiconductor layer (P$^+$) 11.

As illustrated in FIG. 2, a passivation film 17 is disposed on a boundary between the first first-conductivity-type semiconductor layer (P$^+$) 11 and the first second-conductivity-type semiconductor layer (N$^-$) 13 and a boundary between the first second-conductivity-type semiconductor layer (N$^-$) 13 and the second first-conductivity-type semiconductor layer (P$^+$) 21 on the front surface side of the first first-conductivity-type semiconductor layer (P$^+$) 11. Note that the passivation film 17 only needs to be disposed on at least the boundaries, but a passivation film may be disposed on a portion other than the boundaries (see FIG. 2).

Each of the plurality of carrier emitting portions 11a illustrated in FIG. 1 is configured such that an opening is formed in the third second-conductivity-type semiconductor layer (N$^+$) 14 and the first first-conductivity-type semiconductor layer (P$^+$) 11 is located in the opening. In this manner, the plurality of carrier emitting portions 11a are disposed in contact with the first electrode (T1 electrode) illustrated in FIG. 2.

As illustrated in FIG. 1, in plan view, the plurality of carrier emitting portions 11a are disposed between a position 16a apart from the gate electrode 16 by a predetermined distance and an outer edge 16b of the first electrode (T1 electrode) 31 that is an inner edge of the passivation film 17.

Figure 3:
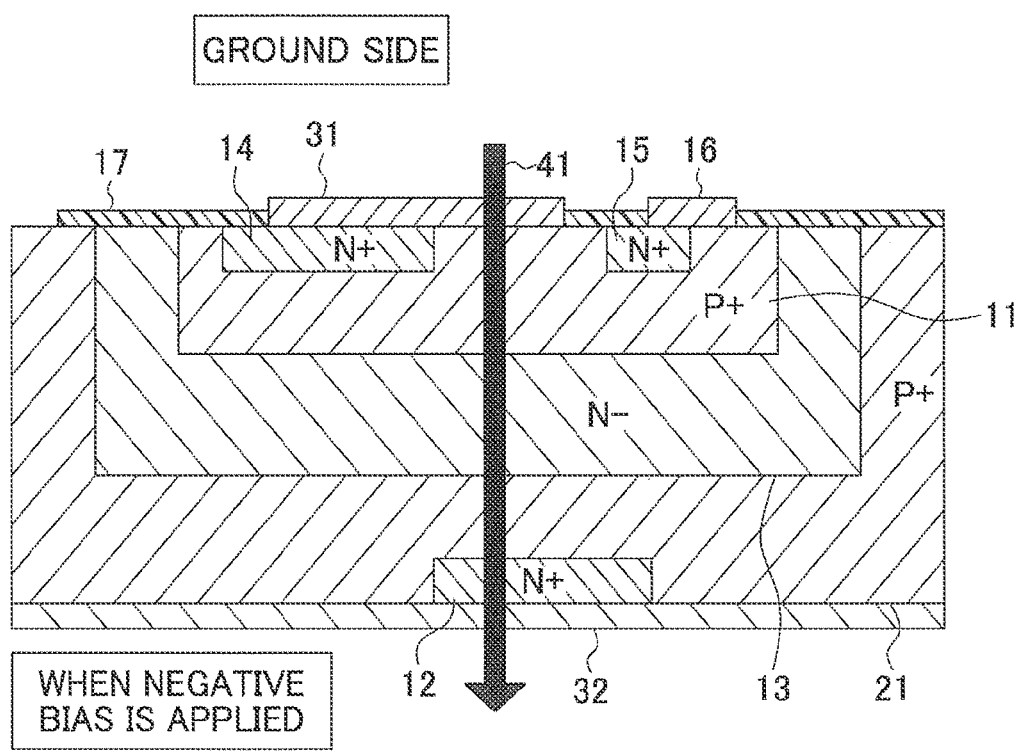
FIG. 3 is a cross-sectional view corresponding to FIG. 2, for describing functions and effects of the bidirectional thyristor according to one aspect of the present invention.
Figure 4:
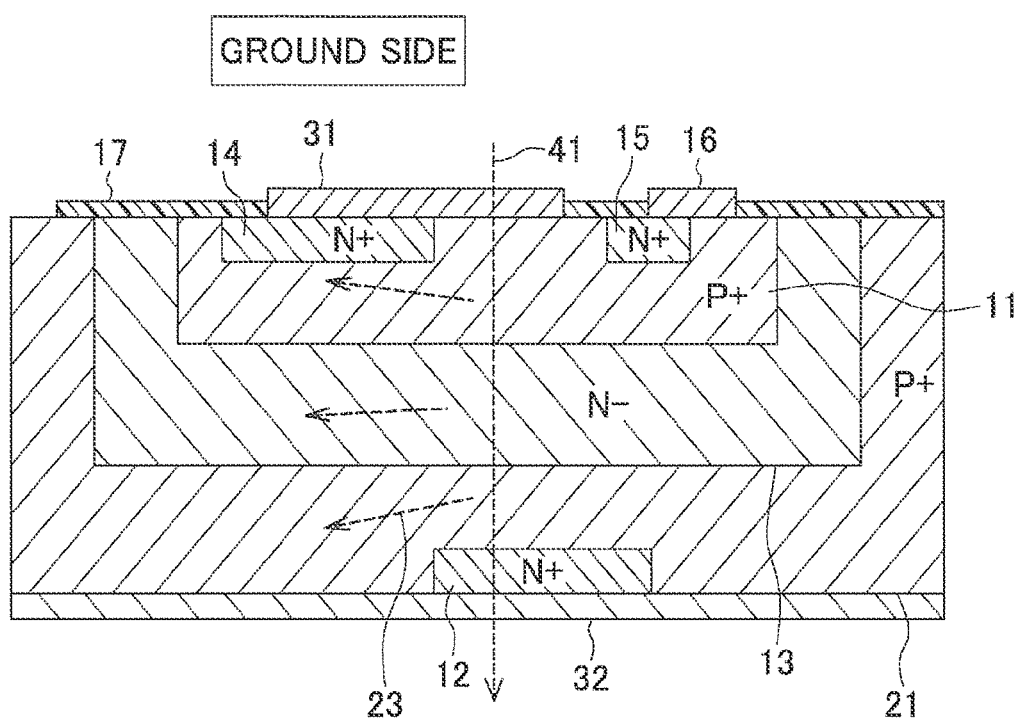
FIG. 4 is a cross-sectional view corresponding to FIG. 2, for describing functions and effects of the bidirectional thyristor according to one aspect of the present invention.

FIG. 3 and FIG. 4 correspond to FIG. 2, and are cross-sectional views for describing functions and effects of the bidirectional thyristor according to one aspect of the present invention. The same parts as in FIG. 2 are denoted by the same reference symbols.

Figure 5:
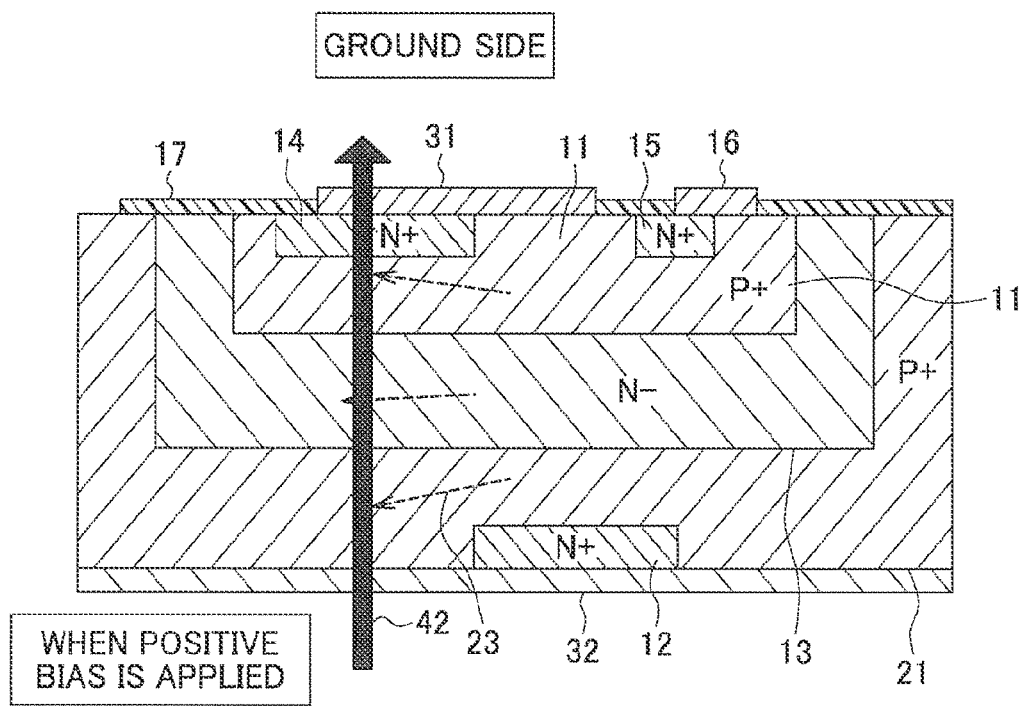
FIG. 5 is a cross-sectional view illustrating a comparative example in which carrier emitting portions 11a have been removed from the bidirectional thyristor according to one aspect of the present invention illustrated in FIG. 2.

FIG. 5 is a cross-sectional view illustrating a comparative example in which the carrier emitting portions 11a have been removed from the bidirectional thyristor according to one aspect of the present invention illustrated in FIG. 2, and is a cross-sectional view for describing a fact that when there is no carrier emitting portion 11a, false turn-on 42 is more likely to occur. The same parts as in FIG. 2 are denoted by the same reference symbols.

Two or more of the plurality of carrier emitting portions 11a are disposed in contact with the outer edge 16b of the first electrode (T1 electrode) 31. As illustrated in FIG. 1, even when a part of the plurality of carrier emitting portions 11a are disposed at the outer edge 16b of the first electrode (T1 electrode) 31, the reduction in area of the third second-conductivity-type impurity diffusion layer (N$^+$) 14 in contact with the first electrode (T1 electrode) 31 is significantly small, which hardly affects VT characteristics and gate characteristics.

As illustrated in FIG. 3, when ground (GND) is connected to the first electrode (T1 electrode) 31, a negative voltage is applied to the second electrode (T2 electrode) 32, and a negative voltage is applied to the gate electrode 16, a gate trigger current flows, so that a current flows through the first electrode (T1 electrode) 31, the first first-conductivity-type semiconductor layer (P$^+$) 11, the first second-conductivity-type semiconductor layer (N$^-$) 13, the second first-conductivity-type semiconductor layer (P$^+$) 21, the second second-conductivity-type semiconductor layer (N$^+$) 12, and the second electrode (T2 electrode) 32 in this order like an arrow 41 due to thyristor operation. In this case, as illustrated in FIG. 4, carriers 23 are diffused in a transverse direction, and the carriers 23 remain even after the current stops flowing due to the thyristor operation. Next, as illustrated in FIG. 2, when no bias is applied to the gate electrode 16 and a positive voltage is applied to the second electrode (T2 electrode) 32, the remaining carriers 23 are processed as ineffective current not via the third second-conductivity-type semiconductor layer (N$^+$) 14 but through the plurality of carrier emitting portions 11a illustrated in FIG. 1, thereby preventing false turn-on. In this case, as illustrated in FIG. 1, in plan view, by setting the area of a triangle 33 formed by adjacent carrier emitting portions 11a located at the outer edge 16b of the first electrode (T1 electrode) 31 and a carrier emitting portion 11a located at the shortest distance from a straight line connecting the adjacent carrier emitting portions 11a to be smaller than the area of a quadrangle 22 formed by carrier emitting portions 11a that are not located at the outer edge 16b of the first electrode (T1 electrode) 31, the remaining carriers 23 can be more effectively processed as ineffective current. Thus, false turn-on can be more effectively prevented, and (dv/dt)c capability can be improved.

Specifically, if two or more carrier emitting portions 11a are not disposed in contact with the outer edge 16b of the first electrode (T1 electrode) 31, as illustrated in FIG. 5, when positive bias is applied to the second electrode (T2 electrode) 32, the remaining carriers 23 exhibit the same effect as a gate trigger current, and hence even when bias is not applied to the gate electrode 16, false turn-on, which shifts to on-operation, is more likely to occur. On the other hand, in the bidirectional thyristor illustrated in FIG. 1 and FIG. 2 having the carrier emitting portions 11a, the remaining carriers 23 are processed as ineffective current, and hence false turn-on does not occur. When a positive voltage is applied to the second electrode (T2 electrode) 32 and bias is applied to the gate electrode 16, a current flows through the second electrode (T2 electrode) 32, the second first-conductivity-type semiconductor layer (P$^+$) 21, the first second-conductivity-type semiconductor layer (N$^-$) 13, the first first-conductivity-type semiconductor layer (P$^+$) 11, the third second-conductivity-type semiconductor layer (N$^+$) 14, and the first electrode (T1 electrode) 31 in this order due to thyristor operation.

Furthermore, the outer edge 16b of the first electrode (T1 electrode) 31 in contact with two or more of the plurality of carrier emitting portions 11a contacts the passivation film 17 (see FIG. 2). In this manner, remaining carriers 23 that remain under the passivation film 17 can also be more effectively processed as ineffective current not via the third second-conductivity-type semiconductor layer (N$^+$) 14 but through the carrier emitting portions 11a disposed at the outer edge 16b of the first electrode (T1 electrode) 31. Thus, false turn-on can be more effectively prevented.

The less possibility of false turn-on illustrated in FIG. 5 described above corresponds to (dv/dt)c capability. A current i when false turn-on occurs can be expressed by the following expression. As dv/dt of the positive bias becomes steeper, a current caused by the remaining carriers 23 becomes larger, and false turn-on is more likely to occur.

$$i = C \cdot dv/dt \quad \text{(Expression)}$$

One measure to suppress the phenomenon of false turn-on is to perform control by lifetime killer owing to a structure for quickly eliminating the remaining carriers 23. However, this causes another problem in that gate characteristics are greatly affected.

Figure 6:
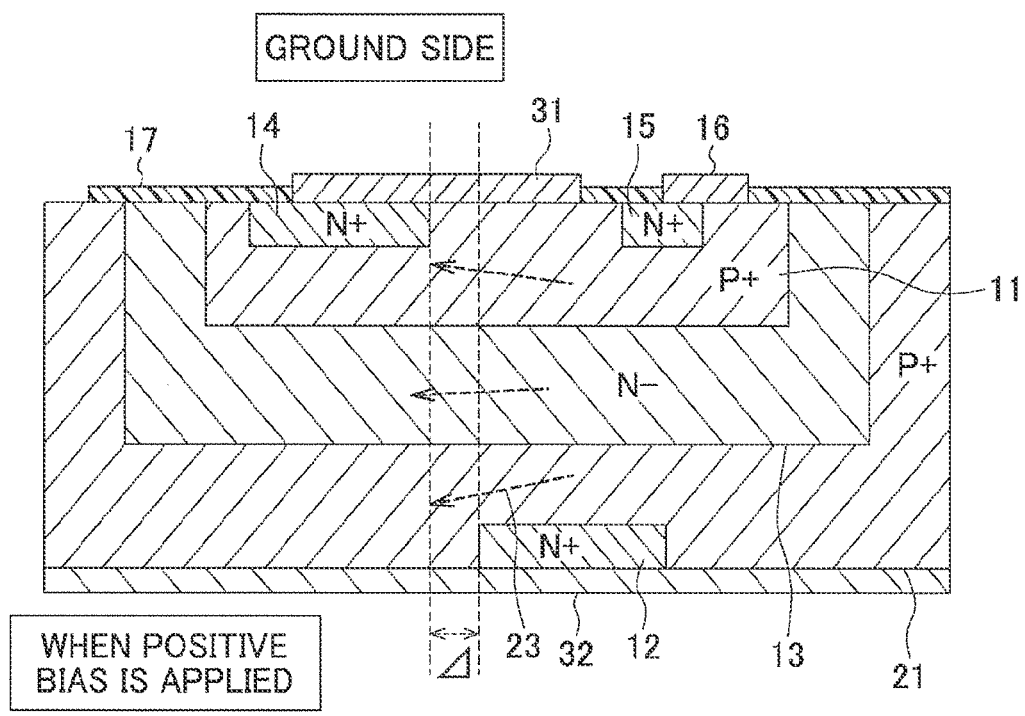
FIG. 6 is a view corresponding to FIG. 2, and is a comparative example of the present invention.

Another measure to suppress the phenomenon of false turn-on is to form a structure in which the remaining carriers 23 are less likely to be diffused in the transverse direction. FIG. 6 illustrates a bidirectional thyristor having this structure. FIG. 6 is a view corresponding to FIG. 2, and is a comparative example of the present invention. The same parts as in FIG. 2 are denoted by the same reference symbols.

As illustrated in FIG. 6, by securing a distance A of vertical $N^+$ (that is, distance A between third second-conductivity-type semiconductor layer ($N^+$) 14 and second second-conductivity-type semiconductor layer ($N^+$) 12 in planar direction), a movement distance of carriers 23 in the transverse direction (planar direction) can be secured. Accordingly, the remaining carriers 23 are less likely to reach an adjacent thyristor. As a result, false turn-on can be prevented.

However, when the bidirectional thyristor in the comparative example illustrated in FIG. 6 has the same chip size as the bidirectional thyristor illustrated in FIG. 2, the area of the third second-conductivity-type semiconductor layer ($N^+$) 14 or the second second-conductivity-type semiconductor layer ($N^+$) 12 in the bidirectional thyristor in the comparative example illustrated in FIG. 6 is reduced due to the above-mentioned distance A as compared to the bidirectional thyristor illustrated in FIG. 2. Thus, a problem in that VT increases or gate characteristics are affected occurs.

In contrast, in the bidirectional thyristor according to one aspect of the present invention illustrated in FIG. 2, the above-mentioned problems do not occur, and false turn-on can be effectively prevented.

Figure 9:
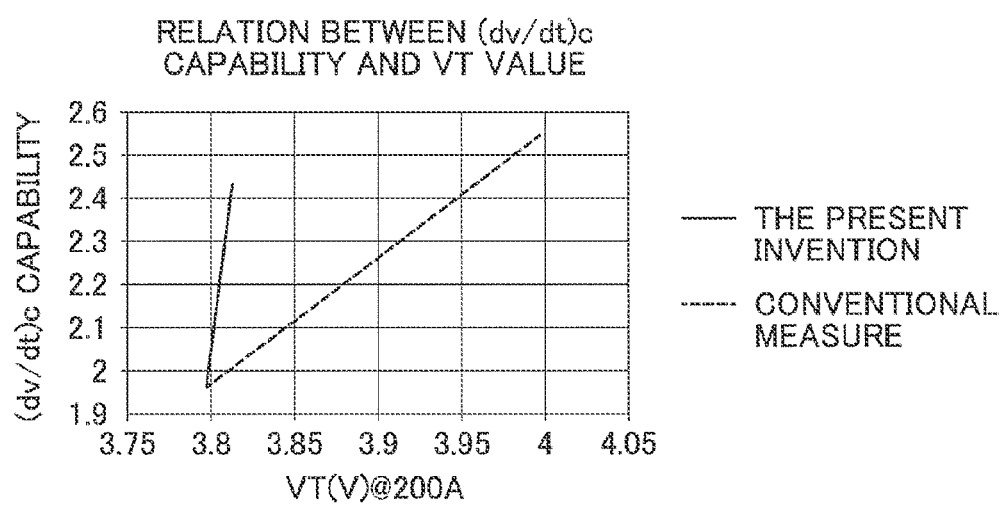
FIG. 9 is a diagram illustrating a result of preparing a sample of the bidirectional thyristor of the present invention illustrated in FIG. 2 and a sample in the comparative example illustrated in FIG. 5 and measuring the relations between VT (turn-on voltage) and (dv/dt)c capability.

FIG. 9 is a diagram illustrating a result of preparing a sample of the bidirectional thyristor of the present invention illustrated in FIG. 2 and a sample in the comparative example illustrated in FIG. 5 and measuring the relations between VT (turn-on voltage) and (dv/dt)c capability.

Figure 10:
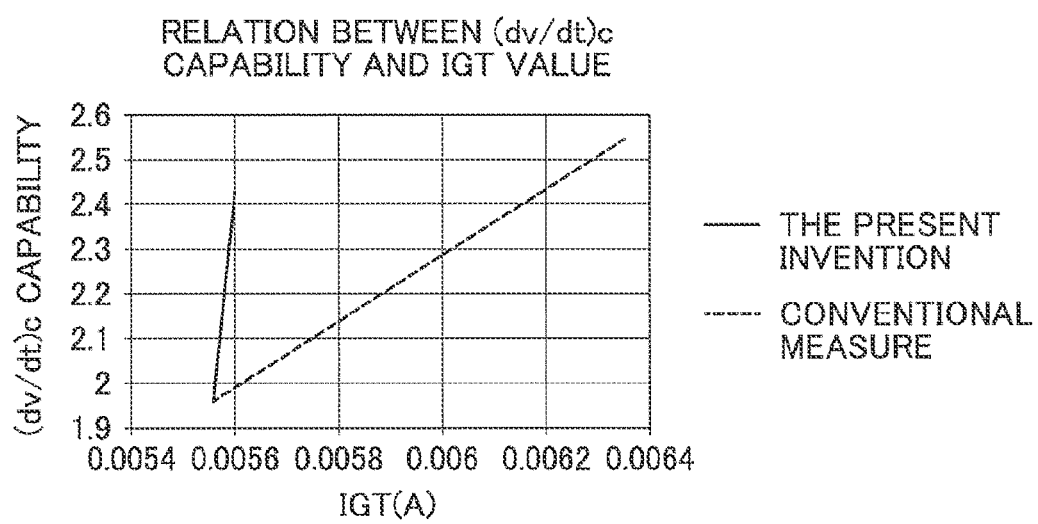
FIG. 10 is a diagram illustrating a result of preparing the sample of the bidirectional thyristor of the present invention illustrated in FIG. 2 and the sample in the comparative example illustrated in FIG. 5 and measuring the relations between IGT (gate trigger current) and (dv/dt)c capability.

FIG. 10 is a diagram illustrating a result of preparing a sample of the bidirectional thyristor of the present invention illustrated in FIG. 2 and a sample in the comparative example illustrated in FIG. 5 and measuring the relations between IGT (gate trigger current) and (dv/dt)c capability.

Figure 11:
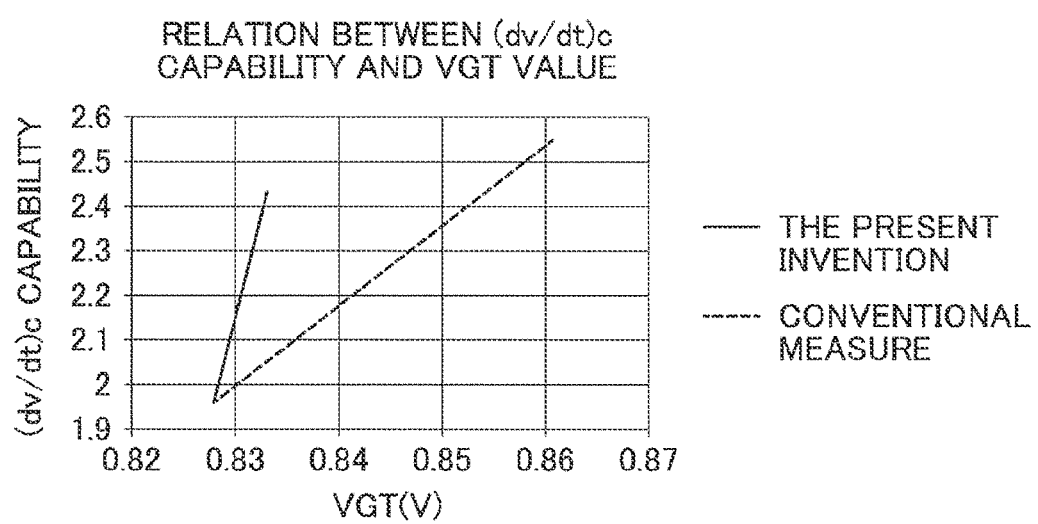
FIG. 11 is a diagram illustrating a result of preparing the sample of the bidirectional thyristor of the present invention illustrated in FIG. 2 and the sample in the comparative example illustrated in FIG. 5 and measuring the relations between VGT (gate trigger voltage) and (dv/dt)c capability.

FIG. 11 is a diagram illustrating a result of preparing a sample of the bidirectional thyristor of the present invention illustrated in FIG. 2 and a sample in the comparative example illustrated in FIG. 5 and measuring the relations between VGT (gate trigger voltage) and (dv/dt)c capability.

In FIG. 9 to FIG. 11, "THE PRESENT INVENTION" corresponds to the measurement results of the sample of the bidirectional thyristor of the present invention illustrated in FIG. 2, and "CONVENTIONAL MEASURES" corresponds to the measurement results of the sample in the comparative example illustrated in FIG. 5.

As illustrated in FIG. 9 to FIG. 11, it was confirmed that (dv/dt)c capability of the bidirectional thyristor of the present invention illustrated in FIG. 2 in which the plurality of carrier emitting portions 11a are formed was improved as compared with the bidirectional thyristor in the comparative example illustrated in FIG. 5 in which the plurality of carrier emitting portions 11a are not formed.

In a bidirectional thyristor according to one aspect of the present invention, two or more carrier emitting portions 11a disposed in contact with the outer edge 16b of the first electrode (T1 electrode) 31 may have a shape selected from a group consisting of a cutout shape, a polygonal shape, and an elliptical shape in plan view.

Figure 7:
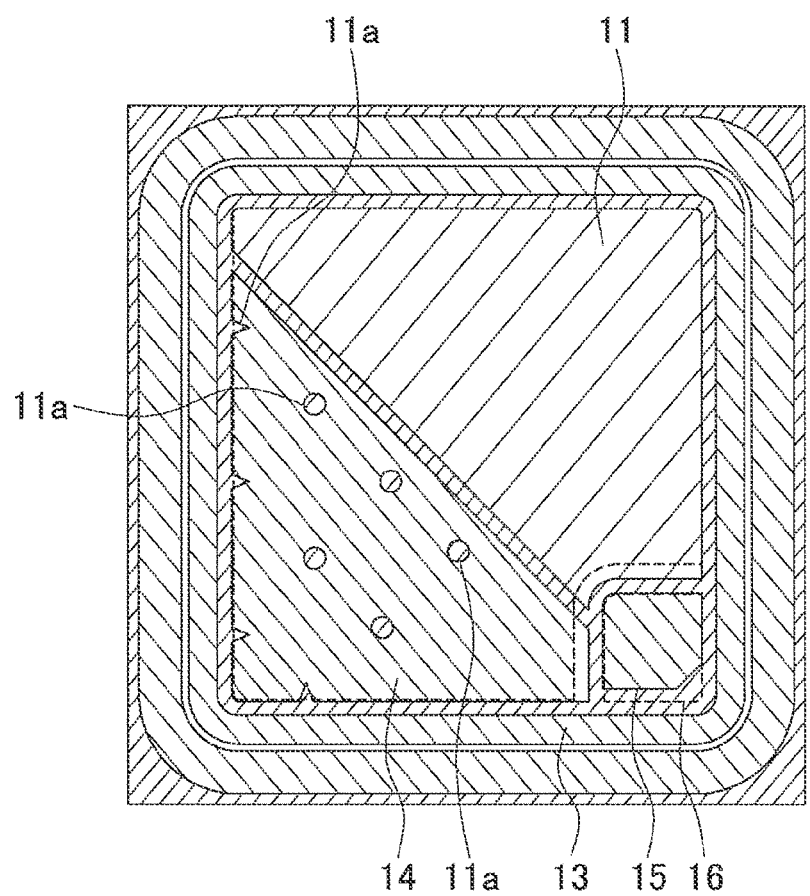
FIG. 7 is a plan view illustrating Modification 1 of the bidirectional thyristor illustrated in FIG. 1.
Figure 8:
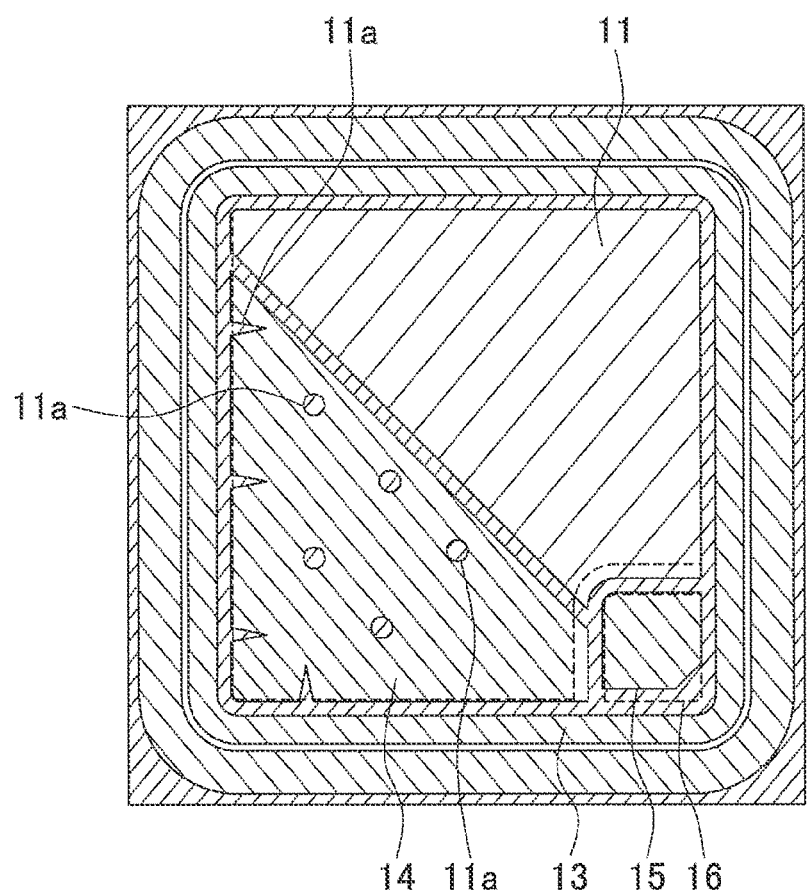
FIG. 8 is a plan view illustrating Modification 2 of the bidirectional thyristor illustrated in FIG. 1.

FIG. 7 is a plan view illustrating Modification 1 of the bidirectional thyristor illustrated in FIG. 1. FIG. 8 is a plan view illustrating Modification 2 of the bidirectional thyristor illustrated in FIG. 1. Note that, in FIG. 7 and FIG. 8, the same parts as in FIG. 1 are denoted by the same reference symbols.

As illustrated in FIG. 1, FIG. 7, and FIG. 8, two or more carrier emitting portions 11a disposed in contact with the outer edge of the first electrode (T1) may have a shape selected from a group consisting of a cutout shape, a polygonal shape, and an elliptical shape in plan view.

In a bidirectional thyristor according to another aspect of the present invention, it is preferred that, in plan view, the density of carrier emitting portions 11a in the vicinity of the outer edge 16b of the first electrode (T1 electrode) 31 be higher than the density of carrier emitting portions 11a in a region other than the vicinity of the outer edge 16b of the first electrode (T1 electrode) 31.

As illustrated in FIG. 1, in plan view, the density of the carrier emitting portions 11a in the vicinity of the outer edge 16b of the first electrode (T1) may be higher than the density of the carrier emitting portion 11a in a region other than the vicinity of the outer edge 16b of the first electrode (T1). The density as used herein refers to a value obtained by dividing the number of carrier emitting portions 11a in the vicinity of the outer edge 16b of the first electrode (T1) illustrated in FIG. 1 by the area of a planar region of the vicinity of the outer edge 16b of the first electrode (T1). As a result, the remaining carriers 11a illustrated in FIG. 2 can be more effectively processed as ineffective current not via the third second-conductivity-type semiconductor layer ($N^+$) 14 but through the carrier emitting portions 11a disposed in the vicinity of the outer edge 16b of the first electrode (T1). Note that the carrier emitting portions 11a in the vicinity of the outer edge 16b of the first electrode (T1) refer to carrier emitting portions 11a that form a triangle 33 illustrated in FIG. 1. The triangle 33 is a triangle 33 formed by adjacent carrier emitting portions 11a located at the outer edge 16b of the first electrode (T1) and a carrier emitting portion 11a located at the shortest distance from a straight line that connects the adjacent carrier emitting portions 11a.

EXPLANATION OF SYMBOLS

11 First first-conductivity-type semiconductor layer ($P^+$)
11 A carrier emitting portions
12 Second second-conductivity-type semiconductor layer ($N^+$)
13 First second-conductivity-type semiconductor layer ($N^-$)
14 Third second-conductivity-type semiconductor layer ($N^+$)
15 Fourth second-conductivity-type semiconductor layer ($N^+$)
16 Gate electrode
16b Outer edge of the first electrode
17 Passivation film
21 Second first-conductivity-type semiconductor layer ($P^+$ type semiconductor substrate: $P^+$)
22 Quadrangle formed by carrier emitting portions that are not located at the outer edge of the first electrode
31 First electrode (T1 electrode)
32 Second electrode (T2 electrode)
33 Triangle formed by adjacent carrier emitting portions located at the outer edge of the first electrode and a carrier emitting portion located at the shortest distance from a straight line connecting the adjacent carrier emitting portions

The invention claimed is:

1. A bidirectional thyristor, comprising:
a first first-conductivity-type semiconductor layer;
a first second-conductivity-type semiconductor layer disposed on a rear surface side of the first first-conductivity-type semiconductor layer;
a second first-conductivity-type semiconductor layer disposed on a rear surface side of the first second-conductivity-type semiconductor layer;
a second second-conductivity-type semiconductor layer disposed on a rear surface side of the second first-conductivity-type semiconductor layer;
a third second-conductivity-type semiconductor layer disposed on a front surface side of the first first-conductivity-type semiconductor layer;
a plurality of carrier emitting portions disposed in the third second-conductivity-type semiconductor layer;
a fourth second-conductivity-type semiconductor layer disposed on the front surface side of the first first-conductivity-type semiconductor layer;
a first electrode that contacts the third second-conductivity-type semiconductor layer, the plurality of carrier emitting portions, and the first first-conductivity-type semiconductor layer;
a second electrode that contacts the second second-conductivity-type semiconductor layer and the second first-conductivity-type semiconductor layer;
a gate electrode that contacts the fourth second-conductivity-type semiconductor layer and the first first-conductivity-type semiconductor layer; and
a passivation film disposed on a boundary between the first first-conductivity-type semiconductor layer and the first second-conductivity-type semiconductor layer and a boundary between the first second-conductivity-type semiconductor layer and the second first-conductivity-type semiconductor layer on the front surface side of the first first-conductivity-type semiconductor layer, wherein
each of the plurality of carrier emitting portions is configured such that an opening is formed in the third second-conductivity-type semiconductor layer and the first first-conductivity-type semiconductor layer is located in the opening,
in plan view, the plurality of carrier emitting portions are disposed between a position away from the gate electrode by a predetermined distance and an outer edge of the first electrode,
two or more of the plurality of carrier emitting portions are disposed in contact with the outer edge of the first electrode which contacts the passivation film, and
in plan view, an area of a triangle formed by adjacent carrier emitting portions located at the outer edge of the first electrode and a carrier emitting portion located at a shortest distance from a straight line connecting the adjacent carrier emitting portion is smaller than an area of a quadrangle formed by carrier emitting portions that are not located at the outer edge of the first electrode.

2. The bidirectional thyristor according to claim 1, wherein the two or more carrier emitting portions disposed in contact with the outer edge of the first electrode have a shape selected from a group consisting of a cutout shape, a polygonal shape, and an elliptical shape in plan view.

3. The bidirectional thyristor according to claim 1, wherein, in plan view, a density of carrier emitting portions in a vicinity of the outer edge of the first electrode is higher than a density of carrier emitting portions in a region other than the vicinity of the outer edge of the first electrode.

* * * * *